(12) United States Patent
Green et al.

(10) Patent No.: US 11,680,888 B2
(45) Date of Patent: *Jun. 20, 2023

(54) METHODS OF NUCLEAR MAGNETIC RESONANCE MEASUREMENT OF CRUSHED POROUS MEDIA

(71) Applicant: Green Imaging Technologies, Inc, Fredericton (CA)

(72) Inventors: Derrick P. Green, Fredericton (CA);
Michael J. Dick, Fredericton (CA);
Taylor Kenney, Fredericton (CA);
Dragan Veselinovic, Fredericton (CA)

(73) Assignee: Green Imaging Technologies, Inc., Fredericton (CA)

( * ) Notice: Subject to any disclaimer, the term of this patent is extended or adjusted under 35 U.S.C. 154(b) by 211 days.

This patent is subject to a terminal disclaimer.

(21) Appl. No.: 16/608,110

(22) PCT Filed: Apr. 26, 2018

(86) PCT No.: PCT/CA2018/000077
§ 371 (c)(1),
(2) Date: Oct. 24, 2019

(87) PCT Pub. No.: WO2018/195646
PCT Pub. Date: Nov. 1, 2018

(65) Prior Publication Data
US 2020/0166449 A1 May 28, 2020

Related U.S. Application Data

(60) Provisional application No. 62/490,363, filed on Apr. 26, 2017.

(51) Int. Cl.
*G01N 15/08* (2006.01)
*G01N 24/08* (2006.01)
*G01R 33/30* (2006.01)

(52) U.S. Cl.
CPC ......... *G01N 15/088* (2013.01); *G01N 24/081* (2013.01); *G01R 33/30* (2013.01)

(58) Field of Classification Search
CPC ..... G01N 15/088; G01N 24/081; G01R 33/30
See application file for complete search history.

(56) References Cited

U.S. PATENT DOCUMENTS

| 7,092,822 B2 | 8/2006 | Lenormand et al. |
| 9,405,037 B2 | 8/2016 | Al-Muthana et al. |

(Continued)

FOREIGN PATENT DOCUMENTS

| CN | 105 866 009 A | 8/2016 |
| CN | 107 831 186 B | 9/2019 |
| GB | 2542406 A | 3/2017 |

OTHER PUBLICATIONS

Coates, G.R., Xiao, L., and Prammer, M.G., NMR Logging. Principles & Applications, Halliburton Energy Services, Houston, 1999.

(Continued)

*Primary Examiner* — Susan S Lee
(74) *Attorney, Agent, or Firm* — Eugene F. Derenyi; Fogler, Rubinoff LLP

(57) ABSTRACT

A method of a nuclear magnetic resonance measurement of a crushed porous media sample, including where the crushed pieces of the sample are not smaller than the pore size of the porous media, the surfaces of the sample are wet with a liquid and the pores of the sample are saturated with a fluid, subjecting the sample to a centrifugal force, performing a nuclear magnetic resonance measurement of the sample, and determining a petrophysical property of the sample from data acquired from the acquisition scan.

22 Claims, 18 Drawing Sheets

---

10 — MEASURING A TOTAL VOLUME ($V_{total}$) BY A NMR $T_2$ SCAN OF A VIAL CONTAINING BRINE
↓
50 — REMOVING THE BRINE FROM THE VIAL
↓
60 — PLACING CRUSHED POROUS MEDIA IN THE VIAL
↓
80 — VACUUM SATURATING THE POROUS MEDIA WITH A BRINE
↓
100 — MEASURING $V_{CUTTINGS+FLUID}$ BY A NMR $T_2$ SCAN OF THE VIAL WITH THE POROUS MEDIA AND THE BRINE OF STEP 80
↓
110 — REMOVING THE BRINE OF STEP 80 FROM THE VIAL
↓
140 — MEASURING $V_{CUTTINGS}$ BY A NMR $T_2$ SCAN OF THE VIAL AND DRILL CUTTINGS
↓
150 — CALCULATING POROSITY OF THE DRILL CUTTING USING EQUATION 2

(56) References Cited

U.S. PATENT DOCUMENTS

| | | | |
|---|---|---|---|
| 10,545,105 B2* | 1/2020 | Gao | G01R 33/448 |
| 2006/0272812 A1 | 12/2006 | Yu et al. | |
| 2009/0228249 A1* | 9/2009 | Green | G01N 15/088 |
| | | | 703/2 |
| 2017/0023540 A1 | 1/2017 | Bona | |
| 2019/0033238 A1* | 1/2019 | Al-Harbi | G01N 24/081 |

OTHER PUBLICATIONS

Geo-Spec 2-53 User Manual, Version 1.8, Oxford Instruments, Jun. 2018.

GIT Systems and LithoMetrix User Manual, Revision 1.9, Green Imaging Technologies, Jan. 2016.

American Petroleum Institute, Recommended Practices for Core Analysis, API Publications, Washington, D.C., (1998), p. 5-7.

Pittman, E. D., Porosity diagenesis and productive capability of sandstone reservoirs, (1979).

International Search Report—PCT/CA2018/000077, dated Jul. 11, 2018.

Althaus, S. et al, NMR Measurement of Porosity and Density from Drill Cuttings of Unconventional Tight Reserviors, SPWL 60th Annual Logging Symposium, Jun. 17-19, 2019.

Mirotchnik, K. et al, A Novel Method to Determine NMR Petrophysical Parameters from Drill Cuttings, SPWLW 45th Annual Logging Symposium, Jun. 6-9, 2004.

Lenormand, R. et al, Advances in Measuring Porosity and Permeability from Drill Cuttings, SPE Reservoir Characterization and Simulation Conference, Oct. 2007, SPE 111286.

M. J. Dick et al; "Quick and Simple Porosity Measurement at the Well Site", Proceedings of the Internatinal Symposium of the Society of Core Analysts Held in Vienna, Austria, Aug. 28-Sep. 2017; Aug. 28, 2017, XP055756929.

Gallegos D. P. et al; "A NMR technique for the analysis of pore structure: Application to materials with well-defined pore structure"; Journal of Colloid and Interface Science Academic Press, Inc. US, vol. 119, No. 1; Sep. 1, 1987, pp. 127-140, XP024208040.

Jonathan Mitchell et al; "A robust nuclear magnetic resonance workflow for quantitative determination of petrophysical properties from drill cuttings"; Journal of Petroleum Science and Engineering, vol. 174, Nov. 20, 2018, pp. 351-361, XP085585692.

Jorge M. Costa Gomes et al; Reservoir Rock Typing Using NMR & Centrifuge; Jan. 1, 2014; pp. 1-6, XP055517955, Online Retrieved from the Internet: URL:http://www.jgmaas.com/SCA/2014/SCA2014-096.pdf [retrieved on Oct. 23, 2018].

European Search Report for EP application 18790104 dated Dec. 21, 2020.

* cited by examiner

METHODS OF NUCLEAR MAGNETIC RESONANCE MEASUREMENT OF CRUSHED POROUS MEDIA

CROSS-REFERENCE TO RELATED APPLICATIONS

This application claims the benefit of U.S. Provisional Application No. 62/490,363, filed on Apr. 26, 2017, which is entirely incorporated herein by reference.

BACKGROUND

Porosity is the single most important petrophysical property. Knowing the porosity of the rocks in an oil field is vital to the profitable development of the field. The porosity is reflective of the amount of oil present in a field. The earlier porosity is known, the earlier decisions can be made about how to best retrieve the oil from the field. Typical measurements of porosity are done via down hole logging tools and core analysis. These methods either do not give immediate feedback of the porosity while drilling, are complex, expensive, or prone to error. In addition, modern drilling produces cuttings that are not suitable for most conventional porosity measurements requiring larger rock samples such as plugs because the cuttings are crushed into very small "grain like" pieces.

BRIEF DESCRIPTION OF THE DRAWINGS

To facilitate further description of the embodiments, the following drawings are provided in which.

DETAILED DESCRIPTION OF EXAMPLES OF EMBODIMENTS

Figure 1A:
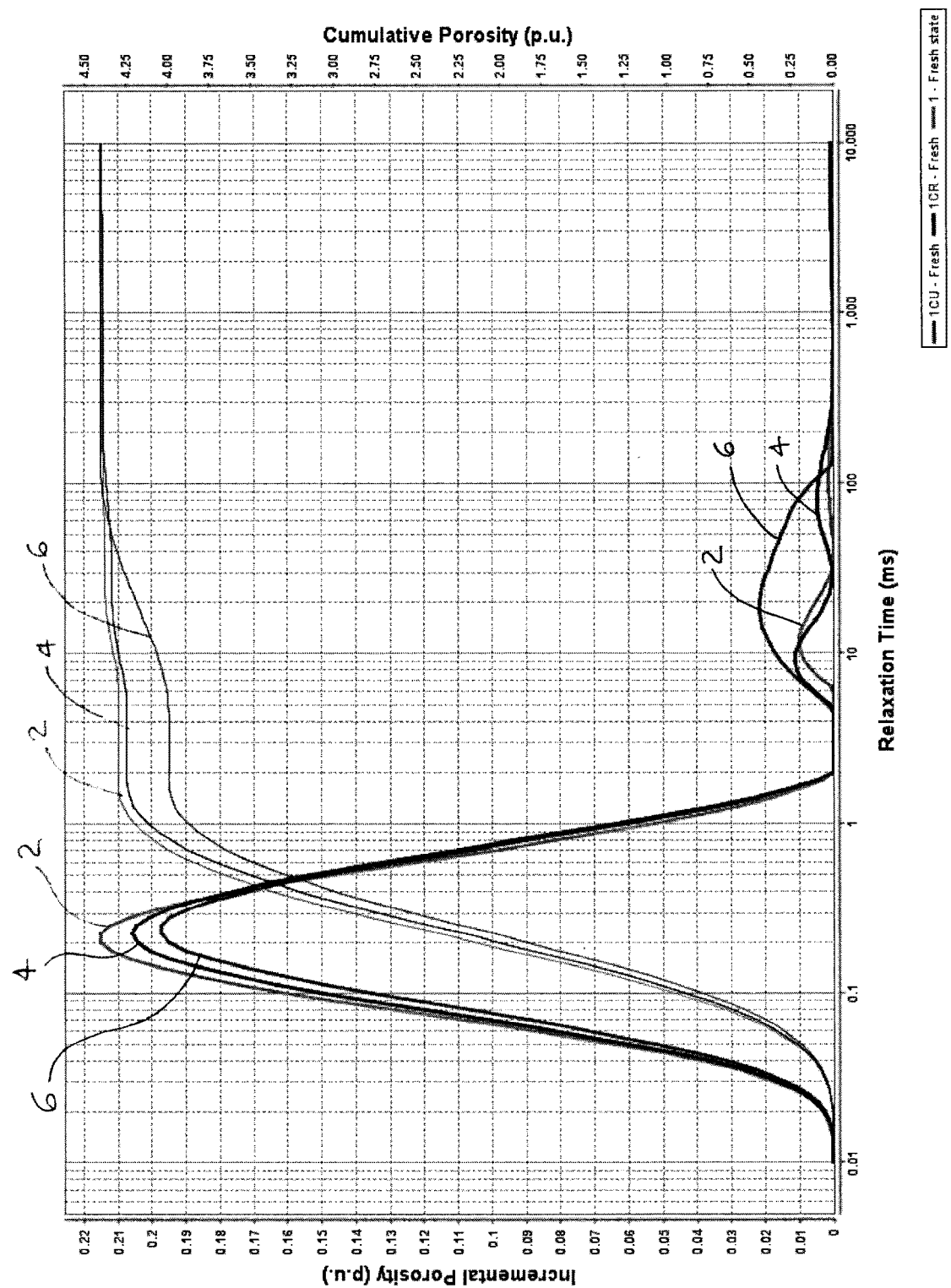
FIG. 1A is a graph comparing the pore size distribution for a shale core plug (green trace 2) a crushed core plug (blue trace 4) and cuttings (red trace 6)
Figure 1B:
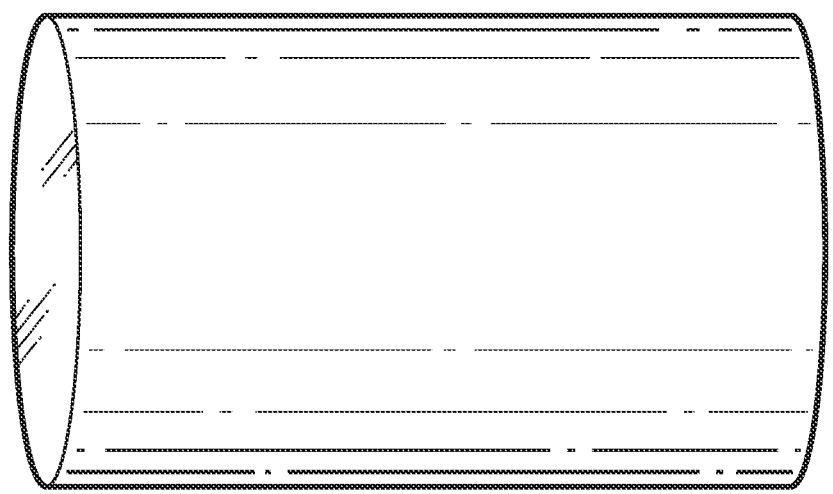
FIG. 1B is a photograph of the shale core plug referenced in FIG. 1A.
Figure 1C:
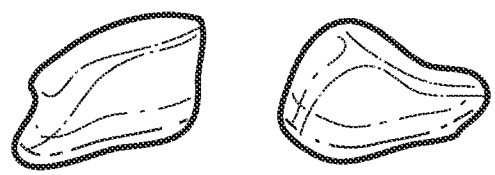
FIG. 1C is a photograph of pieces of the crushed shale core plug referenced in FIG. 1A.
Figure 1D:
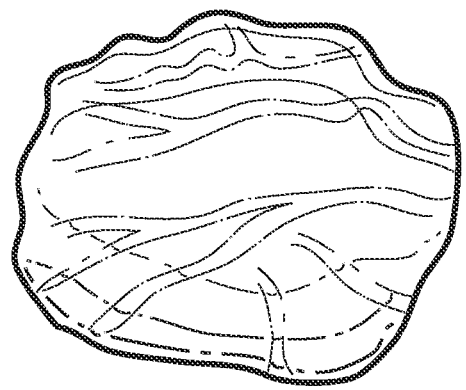
FIG. 1D is a photograph of the cuttings referenced in FIG. 1A.

The present inventors have discovered that nuclear magnetic resonance (NMR) measurements are well suited to overcome the shortcomings of traditional porosity measurements allowing porosity to be determined efficiently and accurately on drill cuttings. The disclosure herein presents in one embodiment a method of a nuclear magnetic resonance measurement of a crushed porous media sample, including where the crushed pieces of the sample are not smaller than the pore size of the porous media, the surfaces of the sample are wet with a liquid and the pores of the sample are saturated with a fluid, subjecting the sample to a centrifugal force, performing a nuclear magnetic resonance measurement of the sample, and determining a petrophysical property of the sample from data acquired from the acquisition scan. In certain embodiments, the centrifugal force is of a sufficient magnitude and duration to remove fluid from the surfaces of the sample. In certain other embodiments, the centrifugal force is of a sufficient magnitude and duration to remove excess fluid from the surface of the sample without removing an amount of fluid from the pores of the sample where the amount of fluid removed from the pores adversely effects the determination of the petrophysical property. The sample may be drill cuttings of an earth formation removed from a wellbore. The fluid may be a liquid or a gas. The method can further include saturating the sample with a fluid that is a nuclear magnetic resonance visible fluid. The crushed porous media may be saturated to 100% using a nuclear magnetic resonance visible fluid. In certain embodiments, the sample is saturated with more than one fluid where at least one fluid is a nuclear magnetic resonance visible fluid. In certain embodiments, the centrifugal force is determined by the size of the sample. In certain other embodiments, the duration is determined by the size of the sample. A Car-Purcell-Meiboom-Gill (CPMG) echo train may be used for the nuclear magnetic resonance measurement In certain embodiments, the petrophysical property is porosity and/or pore size distribution.

The disclosure herein in other embodiments presents a method for nuclear magnetic resonance ("NMR") measurement of a crushed porous media sample, where the crushed porous media sample is at least as large as the pore size of the porous media, including providing a sample vessel which is NMR invisible, providing the measured volume for the sample vessel, placing the sample in the sample vessel and saturating the sample with a fluid, measuring the volume of the sample and the fluid by a NMR scan, removing the fluid from the sample vessel, subjecting the sample in the sample vessel to a centrifugal force, measuring the volume of the sample by a NMR scan following centrifugation, and calculating a petrophysical property of the sample using the measured volume of the sample vessel, the measured volume of the sample and the measured volume of the sample and the fluid.

In certain embodiments, the centrifugal force is of a sufficient magnitude and duration to remove sufficient fluid from surfaces of the sample without removing a significant amount of fluid from the pores. In certain embodiments, the sample comprises drill cuttings of an earth formation removed from a wellbore. In certain embodiments, the fluid is a liquid or a gas. In certain embodiments, the fluid is a brine. In certain embodiments, the sample is saturated to about 100% using the fluid. In certain embodiments, the centrifugal force is determined by a property of the sample. In certain embodiments, the property is sample size. In certain embodiments, the duration is determined by a property of the sample. In certain embodiments, the property is sample size. In certain embodiments, the nuclear magnetic resonance measurement is a Car-Purcell-Meiboom-Gill (CPMG) echo train. In certain embodiments, the petrophysical property is porosity. In certain embodiments, the petrophysical property is pore size distribution. In certain embodiments, the method further including saturating the sample with more than one fluid where at least one fluid is a nuclear magnetic resonance visible fluid and where the petrophysical property is porosity. In certain embodiments, the step of saturating the sample with a fluid is performed under a vacuum. In certain embodiments, the sample is surrounded by a NMR inactive liquid or gas during centrifugation. In certain embodiments, the sample is surrounded by air during centrifugation. In certain embodiments, the volume is measured by filling the vessel to a given level with a brine and performing a NMR scan of the vessel with the brine and determining the volume from the acquired NMR data. In certain embodiments, the vessel is a vial comprising an outlet for draining the fluid from the vial. In certain embodiments, the vial is made from a NMR invisible material. In certain embodiments, the vial further comprises a removable mesh in the outlet for preventing the sample from being removed from the vial when the fluid is drained.

The disclosure herein in another embodiment presents a simple measurement of porosity using benchtop NMR on modern drill cuttings, preferably performed on-site, while drilling. Some embodiments include NMR measurement of drilling cuttings to provide not only the porosity but also the pore size distribution (provided the cuttings are not crushed to be smaller than the pore size). Ignoring diffusion, the relationship between the NMR property $T_2$ and the pore size is governed by the following equation:

$$\frac{1}{T_2} = \frac{1}{T_{2-Bulk}} + \rho \frac{S}{V} \qquad \text{Equation (1)}$$

where S/V is the surface to volume ratio of the pore, $\rho$ is the relaxivity parameter and $T_2$-bulk is the $T_2$ relaxation time of the fluid. The surface, S, to volume, V, ratio is the pore size and if the other terms are ignored, is directly related to the $T_2$ through the relaxivity parameter, $\rho$. Therefore, a plot of volume (retrieved from NMR signal) versus $T_2$ is the pore size distribution. The pore size distribution offers complimentary information to porosity i.e. what size pores the oil is in and hence how hard it will be to retrieve. The ability of NMR measurements to determine the pore size distribution of drill cuttings makes it superior to traditional measurements done on cuttings which do not provide the pore size distribution.

Experiment

NMR methods were tested on both shale and sandstone samples. For the shale samples, $T_2$ distributions were used to determine the porosity of core plugs, crushed core plugs and drill cuttings. The results showed excellent agreement between porosities derived for each sample. For the sandstone samples, $T_2$ distributions were used to determine the porosity of core plugs and drill cuttings which were saturated with water in the lab. The results showed good agreement between the porosity derived for each sample. Some error was observed due to extra water present on the surface of the cuttings. In certain embodiments, the disclosure herein presents methods to minimize this error.

In the initial tests, $T_2$ NMR acquisition scans for the dry or as received sandstone and shale plugs, crushed plugs and cuttings were recorded using an Oxford Instruments Geo-Spec 2-53 rock core analyzer [2]. Data acquisition and data analysis of the $T_2$ data was achieved via Green Imaging Technology software [3]. Comparison between the $T_2$ data for the plugs, crushed plugs and cuttings validated the ability of NMR to accurately measure the pore size distributions of drill cuttings.

Next the ability of NMR to accurately determine the porosity of cuttings was tested by, again, comparing data derived from plugs, crushed plugs and cuttings. The porosity of the cuttings and crushed plug were determined using the following procedure.

Step 1. Run an NMR $T_2$ scan on a vial (or other suitable vessel) filled to a pre-determined level with the saturating fluid to measure the total volume, $V_{total}$.

Step 2. All the samples were vacuum saturated with brine (2% KCl in water) for approximately an hour.

Step 3. The samples were then removed from the brine and their pore volumes and 12 distributions were retrieved.

For the core plugs this is the end of the procedure. The pore volume retrieved along with the bulk volume is used to determine the porosity of the plug. For the cuttings and crushed core plugs, pore volumes retrieved from the NMR data corresponded to the volume of the cuttings ($V_{cuttings}$). This data was used in the remainder of the procedure to determine the porosity of the cuttings and crushed plugs.

Step 4. Place the saturated cuttings or crushed core plug into the vial from Step #1 and remove any fluid above the pre-determined level. Run a $T_2$ scan to measure the volume of the vial's contents, $V_{cuttings+fluid}$.

Step 5. Calculate the porosity of the cuttings using the equation:

$$\text{Porosity} = \frac{\text{Pore volume of cuttings}}{\text{Bulk volume of cuttings}} = \frac{V_{cuttings}}{V_{total} - V_{cuttings+fluid} + V_{cuttings}} \quad \text{Equation (2)}$$

This procedure is straightforward and easy to implement. However, it was found to overestimate the porosity of the cuttings and crushed plugs due water stuck to the surface of the cuttings. This water has an NMR signal and as a result, $V_{cuttings}$ is often inflated in the NMR data leading to a higher than expected porosity value. In one embodiment, the disclosure herein describes deriving an optimal method for removing this surface water without compromising the water in the pores of the cuttings.

Results

Pore Size Distribution of Dry Samples

FIG. 1A is a graph showing a comparison of the pore size distribution for a core plug (green trace), a crushed core plug (blue trace) and cuttings (red trace). All samples came from the same shale formation and were tested in their as received or dry state, Each sample had the same pore size distribution with a peak near a relaxation time of 0.2 ms. This relaxation time is typical of shale samples. The excellent agreement between the pore size distribution of each sample indicated that pore size distribution and hence the porosity of samples is invariant from core plug to cuttings. Several shale samples were tested in this manner and all showed good agreement of their pore size distributions for core plugs, crushed core plugs and cuttings.

The pore size distribution for core plugs, crushed core plugs and cuttings of several sandstone samples were also compared. They also showed good agreement of the retrieved pore size distributions. The only difference between shale and sandstone was that if the sandstone cuttings were crushed to a size smaller than the typical pore size then the pore size information derived from the cuttings would be compromised. This is not the case for shales which have very small pores making it unlikely that the cuttings would ever be crushed smaller than the typical pore size.

Pore Volume Retrieval of Saturated Sandstone Samples

Figure 2A:
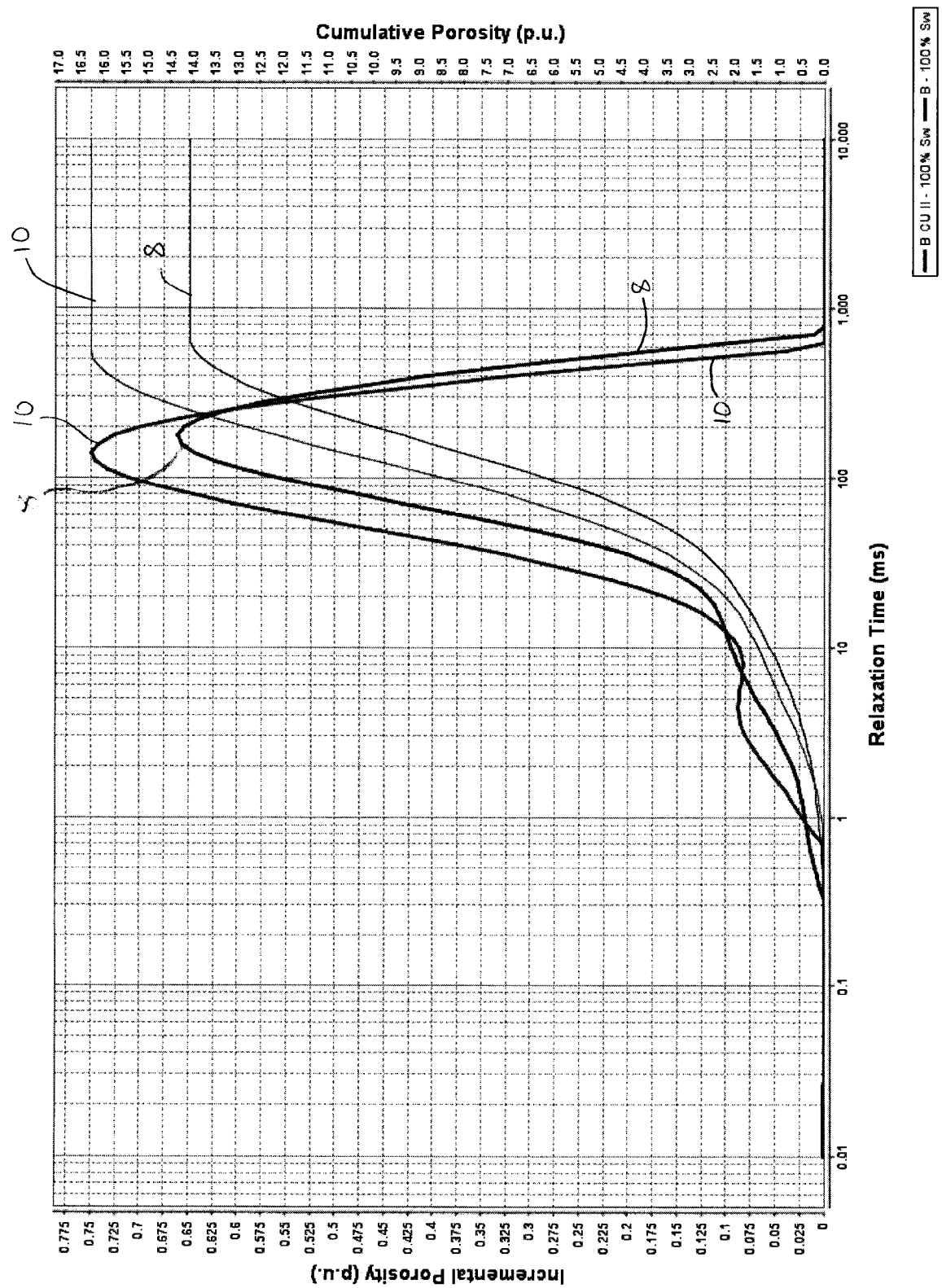
FIG. 2A is a graph comparing the pore size distribution for a sandstone core plug (blue trace 8) and a crushed core plug (red trace 10)

FIG. 2A compares the pore size distribution for a plug (blue trace) and a crushed plug (red trace) taken from the same sandstone formation. The porosity of the crushed plug was determined using the procedure outlined in the last section. The area under each curve is the cumulative porosity for each sample. If all else is equal, the cumulative porosity for each sample should be very similar as the samples were derived from the same formation. From FIG. 2A, it is clear that the porosity derived from the crushed core plug is higher than that derived from the core plug. This is due to extra NMR signal from water stuck to the surface of the crushed samples.

Figure 3A:
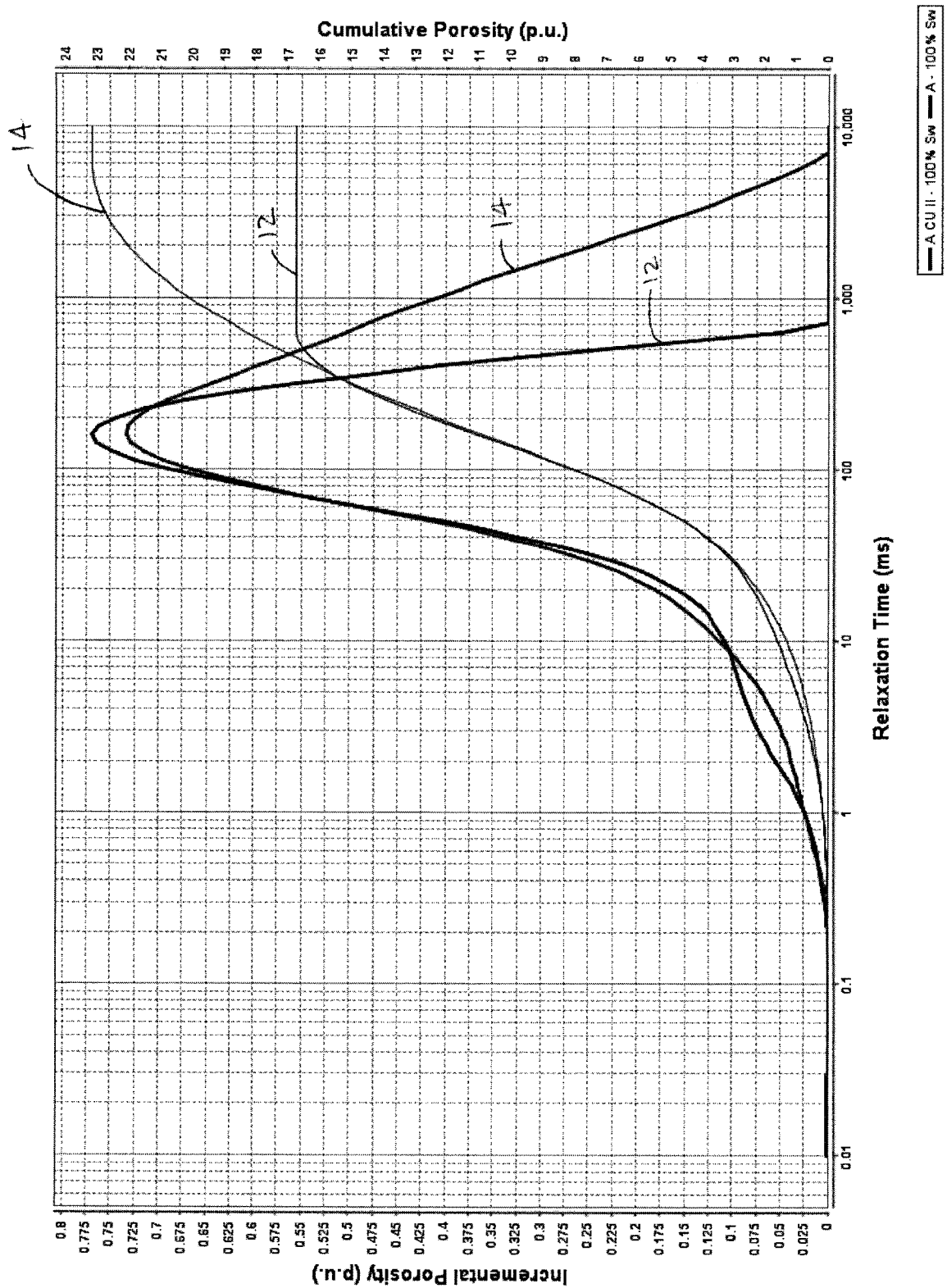
FIG. 3A is a graph comparing the pore size distribution for a sandstone core plug (blue trace 12) and a crushed core plug (red trace 14)
Figure 2B:
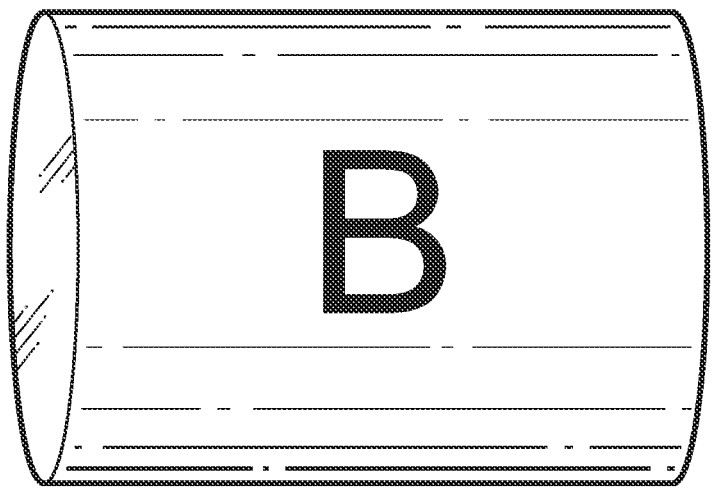
FIG. 2B is a photograph of the sandstone core plug referenced in FIG. 2A.
Figure 2C:
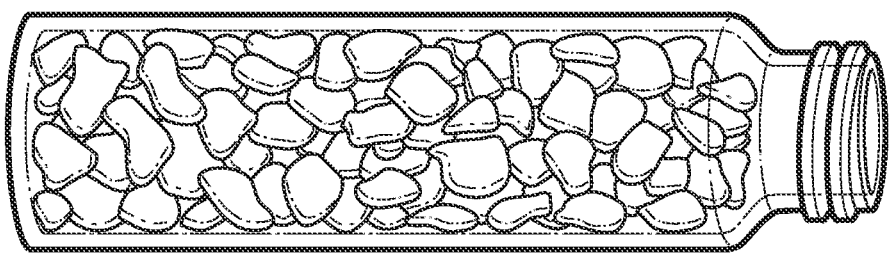
FIG. 2C is a photograph of pieces of the crushed core plug referenced in FIG. 2A.
Figure 3B:
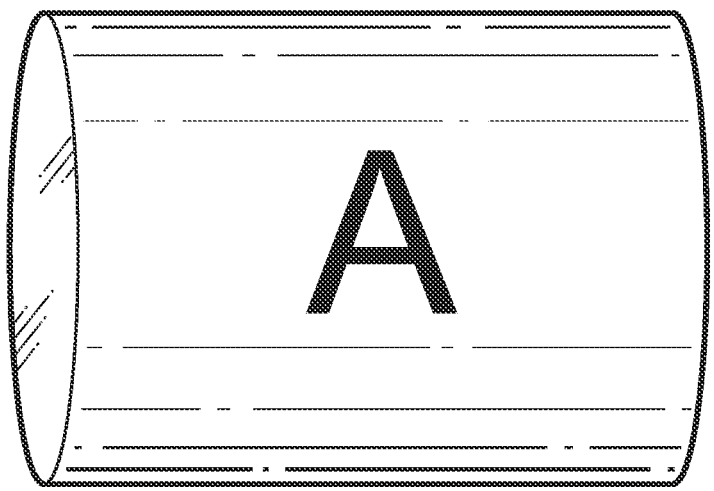
FIG. 3B is a photograph of the sandstone core plug referenced in FIG. 3A.
Figure 3C:
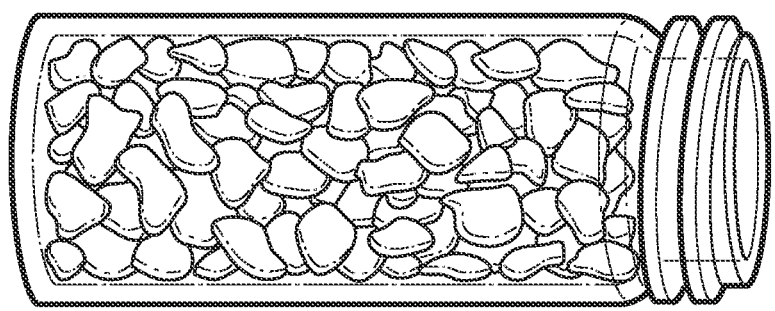
FIG. 3C is a photograph of pieces of the crushed core plug referenced in FIG. 3A.

This becomes more obvious when the pore size distributions in FIG. 3A are examined. In this case, the water on the exterior of the crushed plug has a longer $T_2$ relaxation time than the water in the pores. This results in a shoulder present on the peak of the porosity distribution for the crushed core plug (red trace) and yields a higher cumulative porosity as compared to the core plug (blue trace). Table 1 summarizes the difference between porosities derived from NMR data for core plugs versus crushed core plugs for several sandstone samples tested.

TABLE 1

NMR porosities for core plugs vs. crushed core plugs

| Sandstone | A | B | C | D |
|---|---|---|---|---|
| Core Plug | 16.7 | 14.1 | 16.0 | 15.2 |
| Crushed Core Plug | 23.2 | 16.3 | 18.4 | 22.0 |

In each case the porosity derived from the crushed plug overestimates the porosity by between 2.4 and 6.8 porosity units.

Pore Volume Retrieval of Drill Cuttings

A set of cuttings was provided by ALS Limited (ALS) from one of their drill sites for refinement of our procedure. This was meant to be a blind study and ALS did not provide information on the type of rock from which the cuttings originated. The conventional method of removing excess liquid by means of a dampened paper towel (API 5.2.4,6.2 [4]) was not viable in this case due to the delicate and fragile nature of the cuttings in question. Instead, the procedure outlined in the "Experiment" section above was modified as follows: Steps 1 and 2 were followed as described, Step 3 was omitted and finally Step 4 was also followed as described (hereinafter referred to as the "Modified Procedure"). Once $V_{cuttings+fluid}$ was determined, the brine solution was displaced from around the ALS cuttings by means of introducing a more dense, NMR invisible, fluid, namely Fluorinert™ (FC-40). After the FC-40 was introduced the water, now floating on top of the emulsion, was siphoned off by pipette; at this stage $V_{cuttings}$ could be established by performing a $T_2$ NMR scan.

However, as with the original Steps 1 to 4, the $V_{cuttings}$ $T_2$ NMR scan provided an erroneously high volume value for the cuttings; giving porosity values of 55% and higher, which exceeds the generally accepted sandstone porosity range of 10-40% [5], to say nothing of shale. It was hypothesized at this point, that the spurious signal seen in the $V_{cuttings}$ scans was due to contamination of the cuttings caused by the drilling mud ALS used for boring; thus, ALS was consulted and new cuttings, cleaned per their standard Soxhlet-based procedure, were provided. However, after repeating the Modified Procedure to derive $V_{total}$, $V_{cuttings+fluid}$ and $V_{cuttings}$, the average porosity of the three retested samples was still 54%. Due to there being no significant impact on the calculated porosity figures after cleaning the cuttings it was then hypothesized that the FC-40 was not displacing all of the brine. As a result, the new experimental procedure was still subject to surface water contamination and hence artificially inflated the $V_{cuttings}$ value, leading to an overestimation of the true porosity of the cuttings.

Development of a Method to Remove Surface Water from Crushed Samples

As a result of the failure of the experimental procedures described above to accurately predict the porosity of both crushed core plugs and drill cuttings, it was decided that a more controlled development of a method to remove surface water was needed. A sandstone plug with known parameters, NMR peak, pore volume and porosity, was selected. A slice of this plug, approximately 0.5 cm in length, was removed from the main body. Both the plug and the slice of the plug were then immersed in methanol and cleaned using the Dean-Stark cleaning procedure. After the methanol cleaning, the plug and slice were transferred to toluene for removal of possible oil content, again, via the Dean-Stark cleaning procedure. After cleaning was completed, the slice was pulverized into pieces 1 to 3 mm in diameter. The porosity of the plug was then determined using the pore volume measured by NMR and the bulk volume. This porosity would act as the standard all further tests on the pulverized pieces would be compared against.

Figure 4:
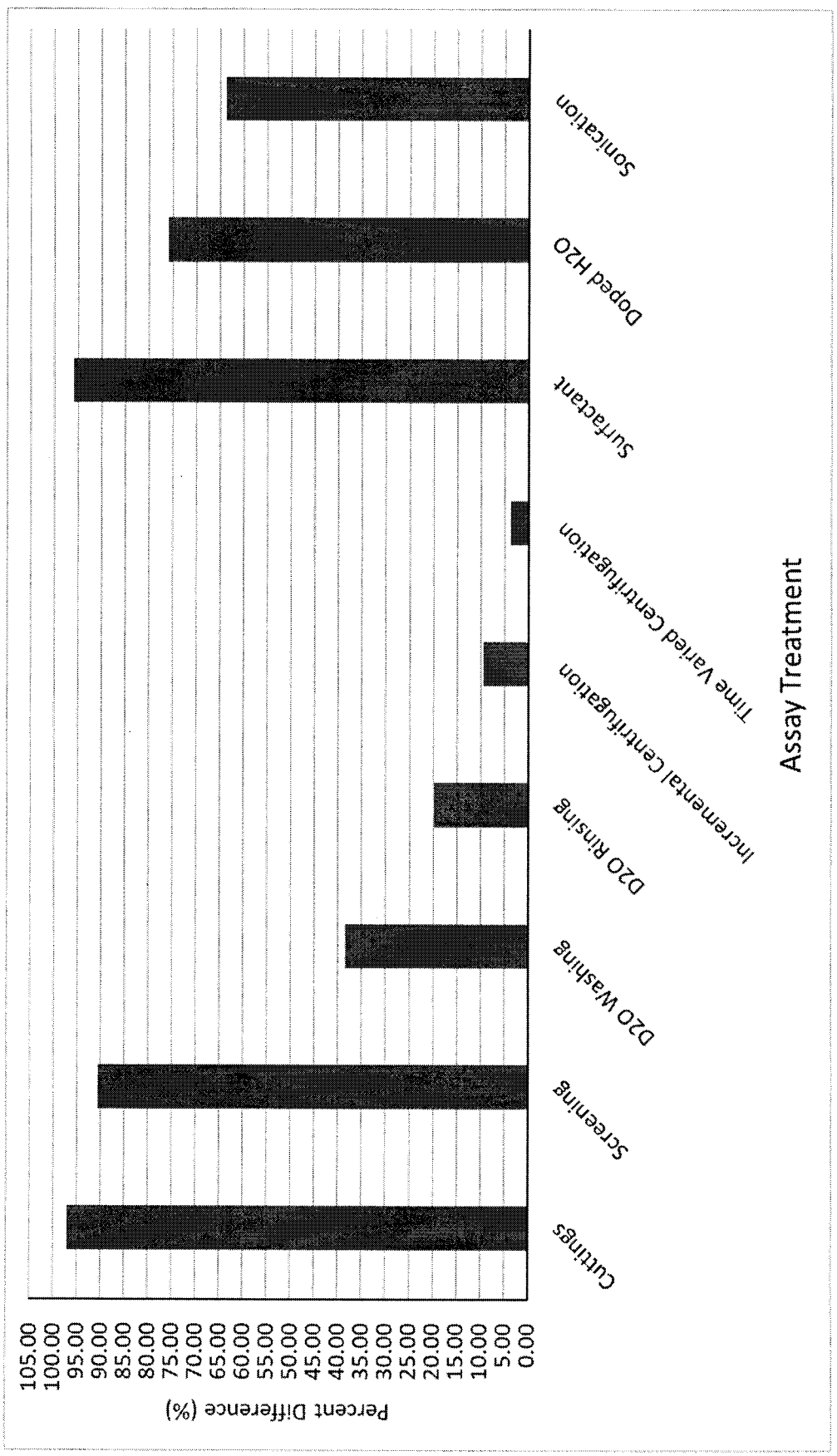
FIG. 4 is a bar graph comparing the porosity determined using methods discussed in the present disclosure to eliminate persistent surface water with the known porosity of a standard core plug.

The initial test on the crushed plug was to employ the Modified Procedure on the crushed pieces. The left most bar in FIG. 4 shows the percent difference between the porosity retrieved from the crushed plug with the porosity of the plug itself. The 97% difference between the two porosities was a clear indication that the technique of FC-40 displacement of surface water did not work effectively.

To further understand now to best eliminate surface water from the crushed plug pieces, six experimental assay groups were tested. They are as follows: screening or size differentiation, $D_2O$ washing, variable centrifugal speed, surfactant infused fluorinert, $CuSO_4$ doped $H_2O$ and sonication. These methods were devised to eliminate the persistent surface or bulk water signal in the $V_{cuttings}$ derived from NMR analysis. For each assay, the original procedure outlined above was followed to generate, clean and saturate the crushed plug pieces. A comparison of the porosity derived from each procedure with the known porosity of the standard core plug is shown in FIG. 4.

The screening assay underwent the same procedure as the original cuttings, however, immediately after pulverization of the plug slice, the cuttings were poured over a wire screen with openings of 1.45 mm. This yielded a percent difference in the calculated porosity of 90%.

The $D_2O$ washing assay followed the original procedure to generate, clean and saturate the crushed plug pieces. The difference in the $D_2O$ washing assay arose after the $V_{brine+cuttings}$ scan was completed. The brine surrounding the cuttings was removed, as much as possible, by pipette. Afterwards, instead of immediately introducing FC-40 to displace the brine, 5 ml of $D_2O$ was first mixed in with the remaining brine. It was thought that the $D_2O$ would mix with any remaining surface water on the crushed core pieces so that any water that remained bound to the cuttings by surface tension would be NMR invisible. After the $D_2O$ was mixed with the brine, FC-40 was introduced to displace and remove the $D_2O$ to prevent it from infiltrating the pore spaces of the cuttings. A variation on this method, $D_2O$ rinsing, simply used the 1.45 mm screen to hold the cuttings while 5 ml of $D_2O$ was poured over them instead of introducing the $D_2O$ directly into the vial. Referring to FIG. 4, the percent difference for these two methods were 38% for the D2O washing and 20% for the $D_2O$ rinsing.

The surfactant assay followed the original procedure but the FC-40 was mixed with a surfactant, SDS, before being introduced to the vial. It was thought that this might aid in the mixing of the existing brine and FC-40 such that it would encourage the removal of the cuttings' surface water. This yielded a percent difference in the calculated porosity of 96%.

The $CuSO_4$ doped $H_2O$ assay was identical in procedure to the original method but, before the introduction of FC-40, the brine present in the vial was removed via pipette and doped $H_2O$ was then mixed in with the remaining brine in the vial. It was hoped that the doped $H_2O$ would mix enough with the surface bound water on the cuttings such that it would separate the surface water signal from that of, the water in the pores of the crushed pieces, at which point it could be easily and definitively subtracted. The concentration of $CuSO_4$ used was approximately 260 g/L. This yielded a percent difference in the calculated porosity of 76%.

The next method tested was sonication. A Branson 3800 sonicator was filled with water and used to vigorously vibrate a partially immersed vial with the crushed core pieces and FC-40 in it. It was thought that such high frequency vibrations would remove any brine still clinging to the outside of the cuttings; the sonication lasted a total of 30 minutes. This yielded a percent difference in the calculated porosity of 64%.

Figure 5:
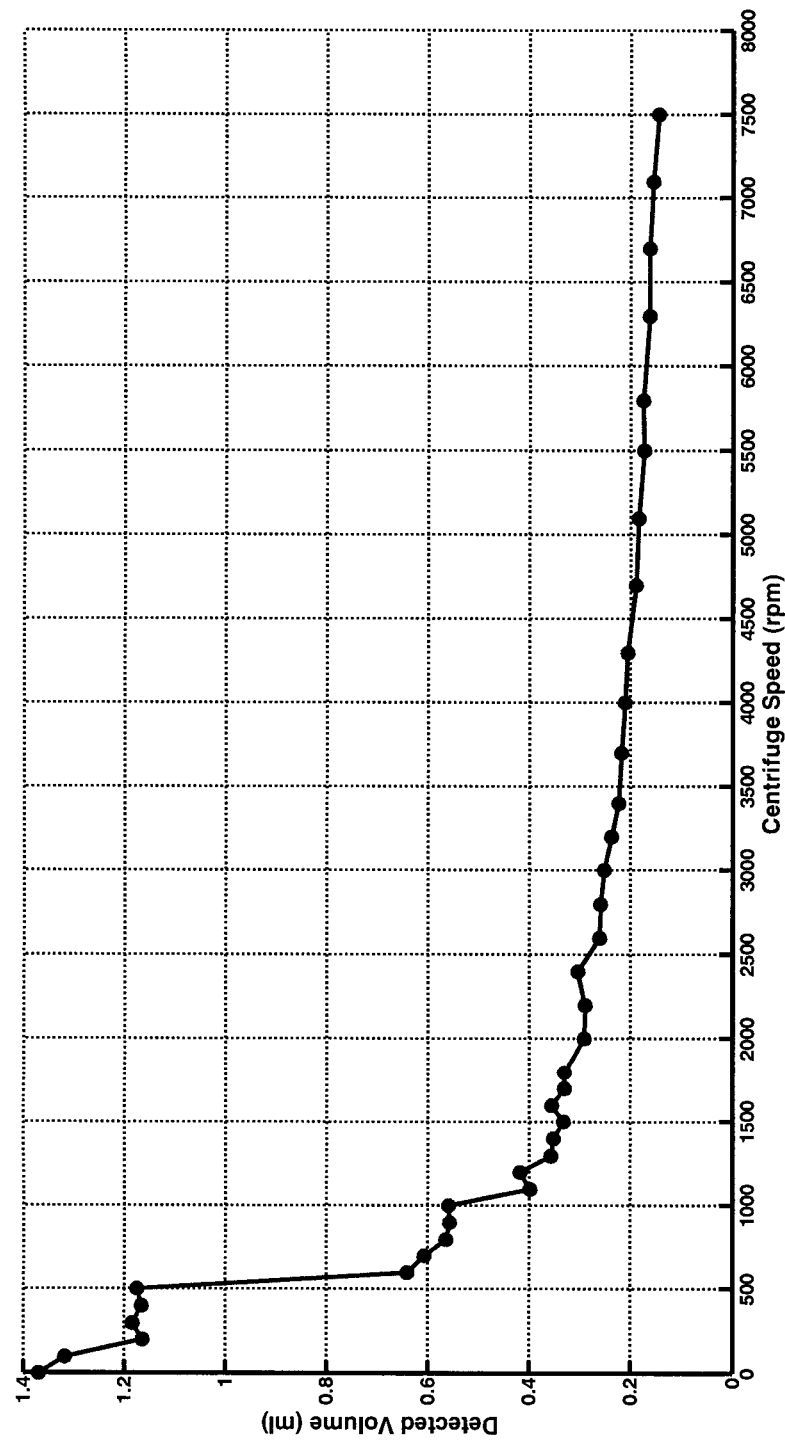
FIG. 5 is a graph of the detected volume in crushed sandstone (blue trace 16) and shale (red trace 18) pieces as a function of centrifuge speed for centrifugation in FC-40.

The final methods tested involved the use of a centrifuge. The variable centrifuge speed method followed the original method. However, after the introduction of FC-40 to the vial, the immersed samples were spun at a range of centrifuge speeds. This centrifugal assay began at 100 RPM and increased in speed up to 7500 RPM with $T_2$ NMR scans ($V_{cuttings}$) being taken after each speed, each speed step lasted for 15 minutes. FIG. 5 shows the detected volume at each centrifuge speed. From FIG. 5, a clear drop in the detected volume is seen between 500 and 600 rpm and between 1000 and 1100 rpm. The $T_2$ NMR scans taken at these speeds show significant reduction to the long $T_2$ components. The present inventors interpret this reduction to be water leaving the surface of the crushed pieces. If the $V_{cuttings}$ is taken as the detected volume at 1100 rpm, then the percent difference is 9.4% between the calculated porosity and the known porosity. The present inventors interpret any further decrease in detected volume beyond 1100 rpm to be due to water leaving the pore volume due to the ever-increasing centrifugal force. This is further confirmed by the $T_2$ NMR scans at these speeds which show any further reduction in detected volume coming from the shorter $T_2$ components corresponding to water in the pores. In certain embodiments, the centrifuge speed may be able to be predetermined by examining (or screening) the cutting size. Smaller drill cutting sizes will require more force and thus a higher centrifuge speed to remove the excess water from the surface of the cuttings.

Another experimental assay involving centrifugation was time varied centrifugation. Based on the results from the variable centrifuge speed method, 1100 rpm was selected as the centrifuge speed which captured most of the crushed pieces surface water loss. The pieces were then spun at 1100 rpm for varying amounts of time. The detected volume was then measured via $T_2$ NMR scans after each spin time. After 36 minutes of centrifugation the detected volume yielded a porosity within 4% of the known porosity.

To determine the repeatability of the centrifugation method, four samples of crushed pieces were processed using centrifugation at 1100 rpm for 35 mins. The retrieved volumes after centrifugation all yielded porosities within 3% of the expected porosity.

The magnitude of the centrifugal force and the duration of the centrifugation is determined by the size of the crushed core pieces.

Figure 6:
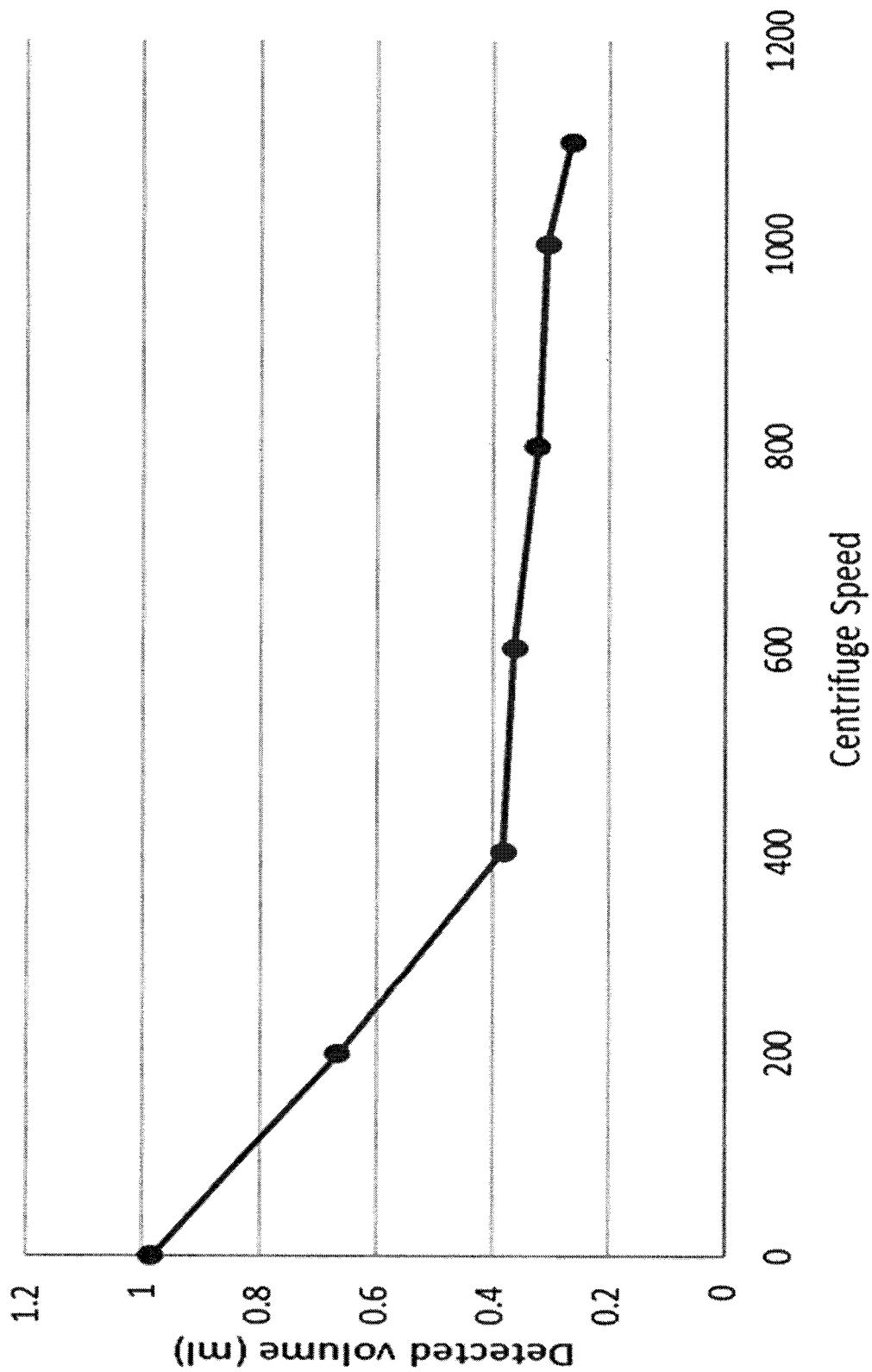
FIG. 6 is a graph of the detected volume in crushed sandstone pieces as a function of centrifuge speed for centrifugation in air.
Figure 7A:
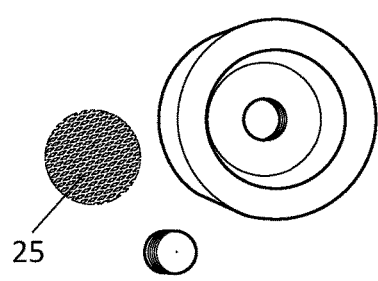
FIG. 7A is a photograph of a top view of a TEFLON® (tetrafluoroethylene or polytetrafluoroethylene) vial employed for centrifugation of the cuttings in air with both the TEFLON® (tetrafluoroethylene or polytetrafluoroethylene) Threaded Insert and TEFLON® (tetrafluoroethylene or polytetrafluoroethylene) Mesh removed.
Figure 7B:
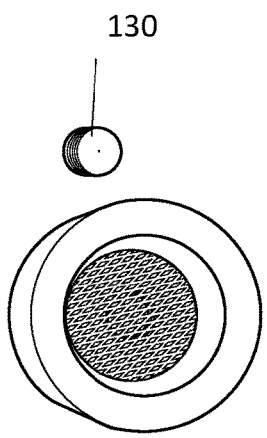
FIG. 7B is a photograph of the Teflon vial of FIG. 7A with the TEFLON® (tetrafluoroethylene or polytetrafluoroethylene) Mesh inserted and the TEFLON® (tetrafluoroethylene or polytetrafluoroethylene) Threaded Insert removed.
Figure 7C:
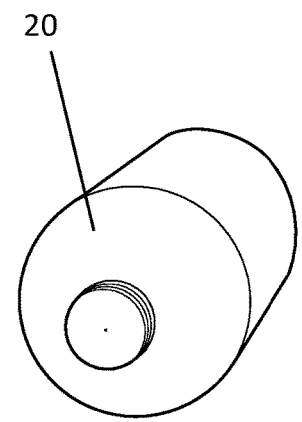
FIG. 7C is a photograph of the Teflon vial of FIG. 7A with both the TEFLON® (tetrafluoroethylene or polytetrafluoroethylene) Threaded Insert and the TEFLON® (tetrafluoroethylene or polytetrafluoroethylene) Mesh in place.
Figure 8:
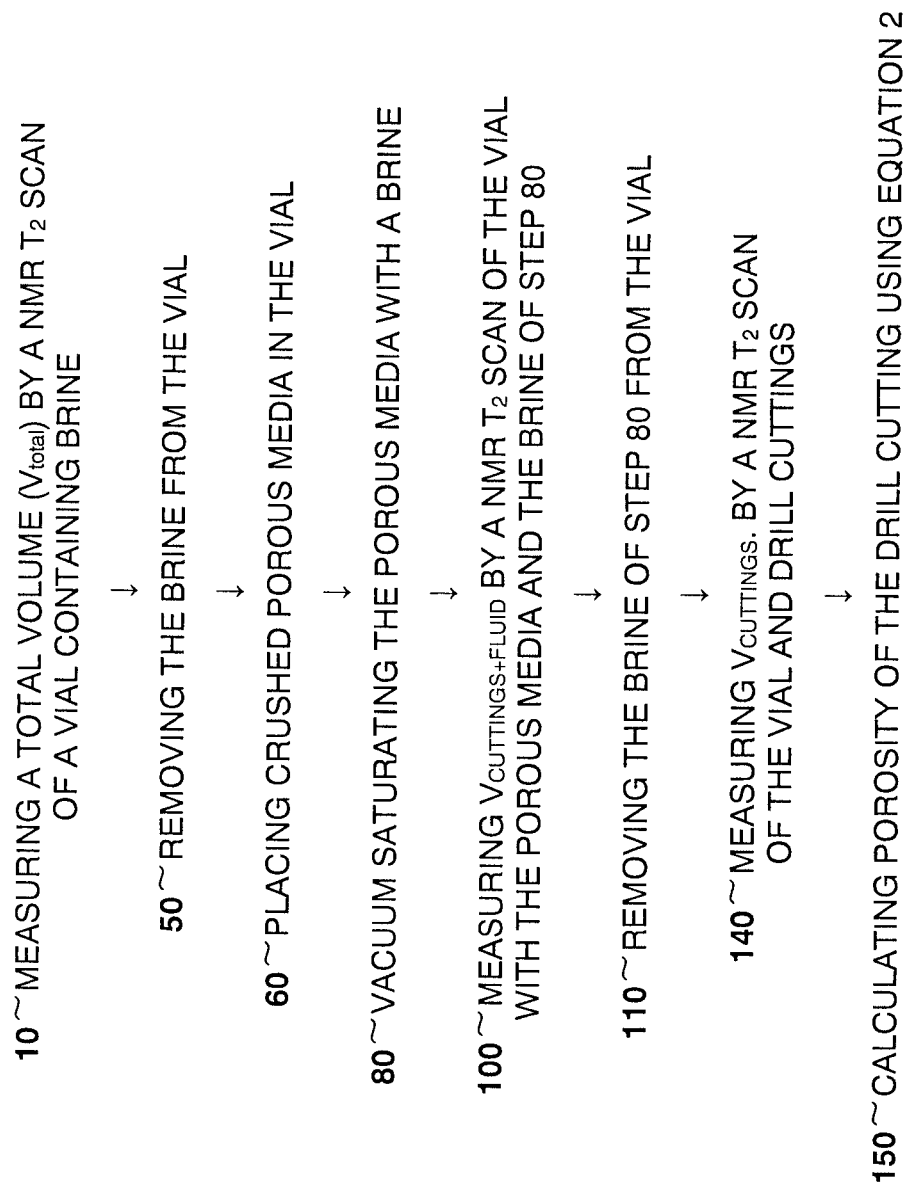
FIG. 8 is a flowchart of a method according to an embodiment of the present invention.
Figure 9:
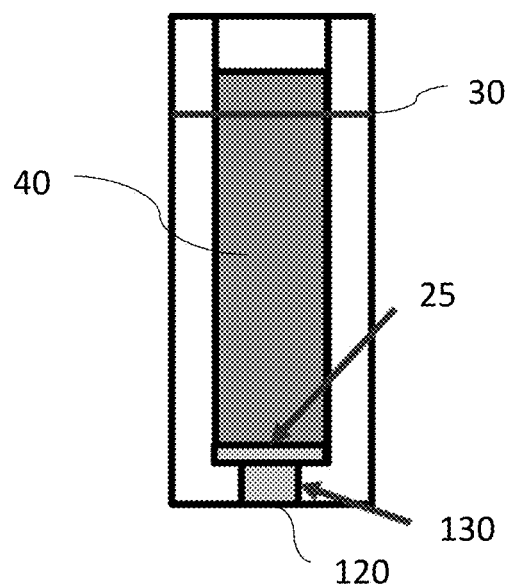
FIG. 9 is a diagram of a vial according to an embodiment of the present invention with the TEFLON® (tetrafluoroethylene or polytetrafluoroethylene) insert in place and containing brine.
Figure 10:
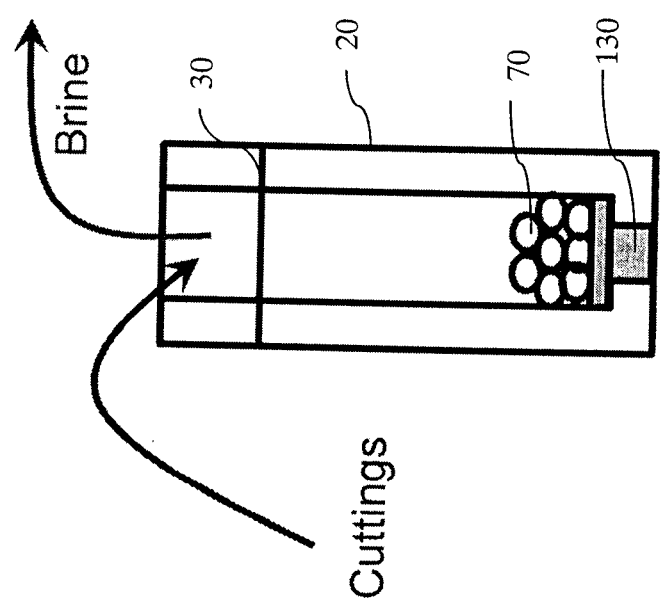
FIG. 10 is a diagram of the vial of FIG. 9 containing drill cuttings.
Figure 11:
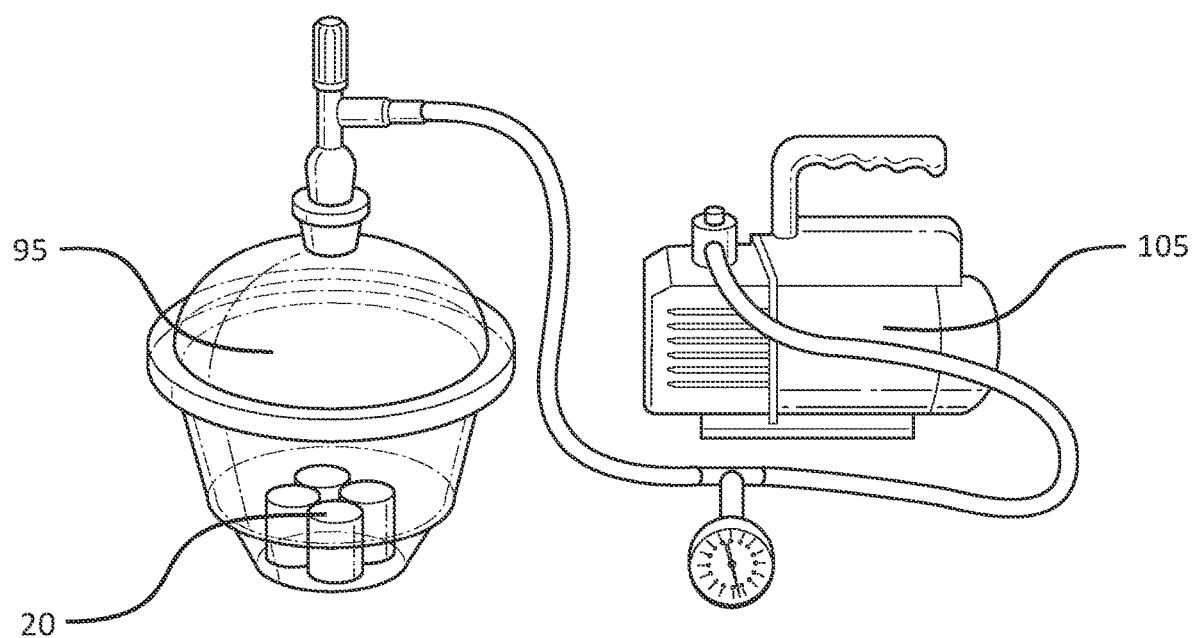
FIG. 11 is a photograph of a vacuum jar containing vials according to embodiments of the present invention, connected to a vacuum pump.
Figure 12:
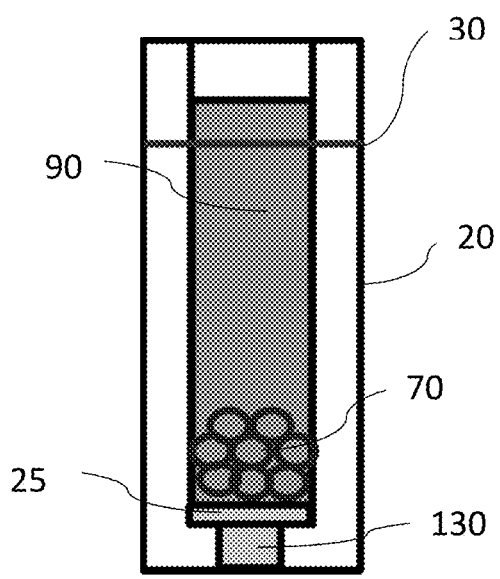
FIG. 12 is a diagram of the vial of FIG. 9 containing brine and drill cuttings.
Figure 13:
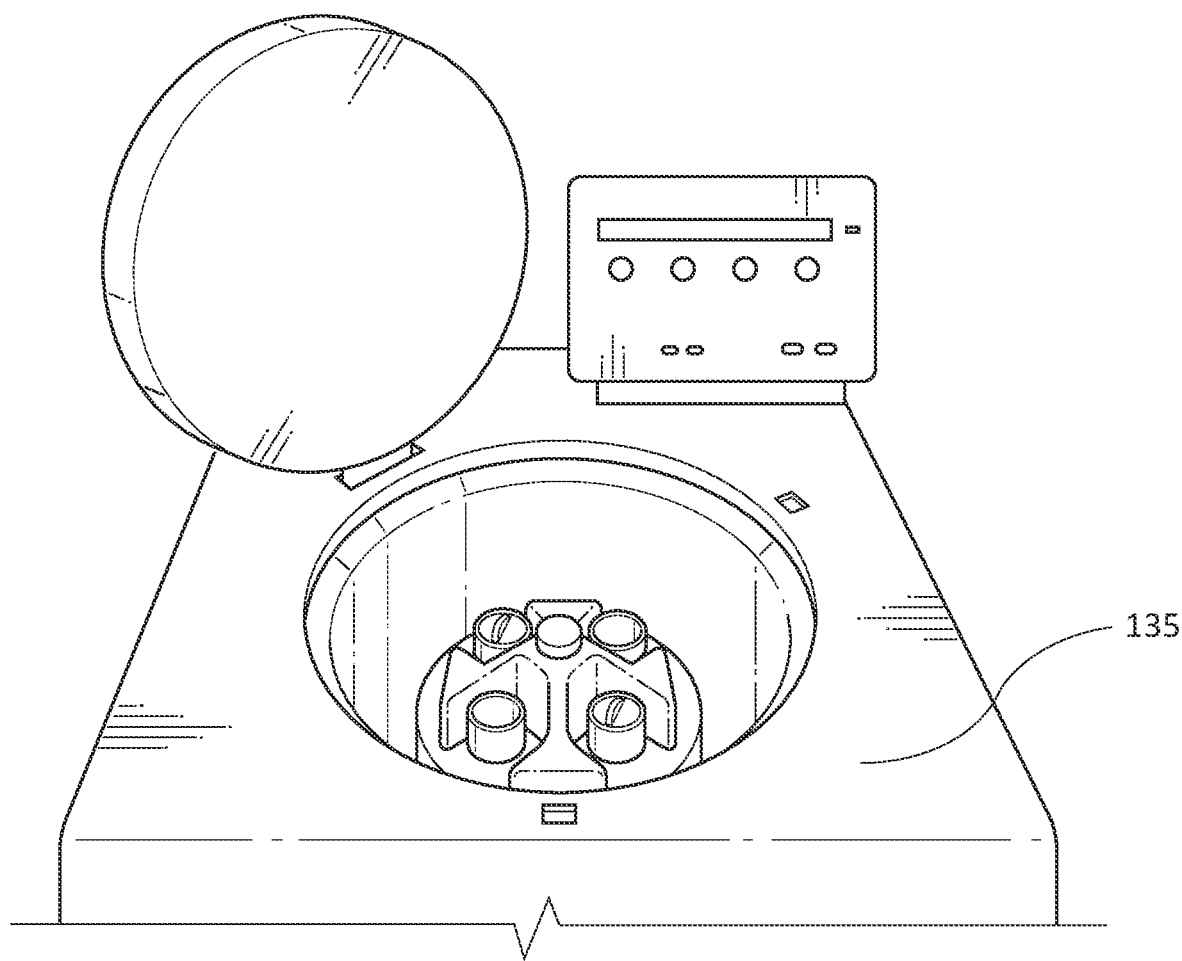
FIG. 13 is a photograph of a centrifuge with vials according to embodiments of the present invention; and, FIG. 14 is a diagram of the vial of FIG. 9 containing drill cuttings with the TEFLON® (tetrafluoroethylene or polytetrafluoroethylene) insert removed.
Figure 14:
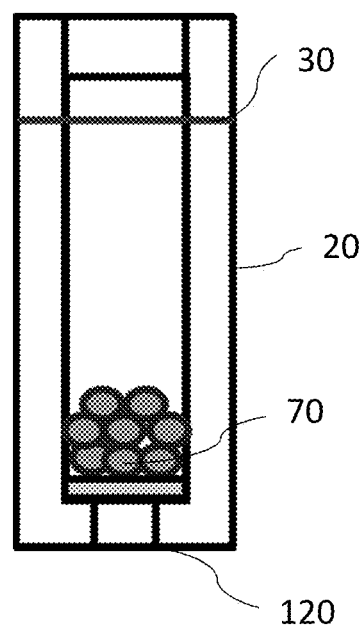

Implementing a Procedure for Eliminating Surface Water from Cuttings Using Air In Lieu of Fluorinert While the technique of centrifugation of the cuttings in FC-40 to eliminate surface water was successful, the use of FC-40 makes it expensive to implement. A new method was developed to employ air in lieu of FC-40 to eliminate water from the surface of the cuttings. The first step was to generate a centrifuge speed versus water saturation curve for centrifugation in air. FIG. 6 shows a graph of centrifuge speed versus detected volume (of water). As with centrifugation in FC-40 (FIG. 5), there is a clear decrease detected water with centrifugation speed. In one embodiment, the optimal centrifuge speed in air for the elimination of surface water was chosen to be 1100 RPM for 35 mins. In other embodiments, other centrifuge speeds can be chosen. The accuracy of centrifugation in air was tested using the crushed pieces of known porosity. The porosity of these pieces was reproduced within 5% of their known porosity.

Development of a TEFLON® (Tetrafluoroethylene or Polytetrafluoroethylene) Vial for Centrifugation in Air In order to implement centrifugation in air of the cuttings, a new vial was developed that met the following criteria:
1. NMR invisible,
2. capable of doing both centrifugation and NMR measurement in same vial, and
3. allow excess surface water to be eliminated from vial during centrifugation.

To satisfy the first two criteria, TEFLON® (tetrafluoroethylene or polytetrafluoroethylene) was chosen as it is both strong enough to withstand centrifugation and is NMR invisible. Other suitable materials can also be used. In one embodiment, doing all the steps of the porosity determination procedure in one vial eliminates errors due to transferring the cuttings from on vial to another. Referring to FIGS. 7A-C, FIG. 9, FIG. 10, FIG. 12 and FIG. 14, a TEFLON® (tetrafluoroethylene or polytetrafluoroethylene) vial 20 according to an embodiment includes a cup with a threaded outlet 120 in the bottom of the vial 20. To eliminate the surface water from the vial 20 during centrifugation, a threaded insert 130 and a TEFLON® (tetrafluoroethylene or polytetrafluoroethylene) mesh 25 were employed. The threaded insert 130 is threaded into the outlet 120 of the vial 20 when $V_{cuttings+fluid}$ and $V_{total}$ are measured. The threaded insert 130 is removed when cuttings in the vial 20 are centrifuged in air. Excess surface water is pushed out through the outlet 120 during centrifugation and the mesh 25 when in place over the outlet 120 ensures the cuttings remain in the vial 20. The threaded insert 130 is then inserted into the bottom of the vial 20 and $V_{cuttings}$ is then measured in the same vial after centrifugation.

Final Procedure for Measuring Porosity of Cuttings

With reference to FIGS. 8 to 14, a method for determining the porosity of crushed porous media with NMR according to one or more embodiments of the present invention including the steps of:

In step 10, measuring a total volume, $V_{total}$ by a NMR $T_2$ scan of a TEFLON® (tetrafluoroethylene or polytetrafluoroethylene) vial 20 filled to above a pre-determined fill level 30 marked on the vial 20 with a saturating brine 40 (which can be a brine of 2% KCl in water for example). In other embodiments, other types of vessels can be used in place of vial 20 provided that the vessels are constructed such that they are NMR invisible. In still further embodiments, the vessels can be constructed such that they are usable for both centrifugation and NMR measurement in the same vessel. In still further embodiments, step 10 can be omitted if the volume of the vial 20 is known or determined by other means such as using a calibrated test tube for example. In step 50, removing the saturating brine 40 from the vial 20. In other embodiments, step 50 can be omitted if the volume of the vial is known. In step 60, placing drill cuttings 70 in the vial 20. In other embodiments, the drill cuttings 70 can be other crushed porous media. In step 80, vacuum saturating the drill cuttings 70 with a brine 90 in the vial 20 with the level of the brine 90 in the vial 20 above the pre-determined level 30. In one embodiment, to carry out the vacuum saturation, the vial 20 is placed in vacuum chamber 95 which is connected to a vacuum pump 105. In step 100, measuring $V_{cuttings+fluid}$ by a NMR $T_2$ scan on the vial 20 with the drill cuttings 70 and brine 90. In step 110, removing the brine 90 from the vial 20 leaving only the saturated drill cuttings 70 behind. In one embodiment, the brine 90 can be removed using a syringe. In another embodiment, the brine 90 can be removed by providing an outlet 120 in the vial 20 that can be opened (such as by removing the threaded insert 130) to drain the brine 90. In step 130, centrifuging the drill cuttings 70 in air while allowing residual brine to drain from the vial 20. A conventional centrifuge 135 can be used. In step 140, measuring $V_{cuttings}$ by a NMR 12 scan of the vial 20 with the drill cuttings 70 following the centrifugation in step 130. In step 150, calculating porosity of the drill cuttings 70 using Equation 2.

Testing of the Centrifugation Technique Using ALS Cuttings

Once a reliable method for determining the porosity of crushed media was developed, the investigation turned back to the drill cuttings provided by ALS.

These cuttings were processed using the centrifugation method described in the last section with centrifugation taking place for 35 min at 1100 rpm.

REFERENCES

1. Coates, G. R., Xiao, L., and Prammer, M. G., *NMR Logging. Principles & Applications*, Halliburton Energy Services, Houston, 1999.
2. Geo-Spec 2-53 User Manual, Version 1.8, Oxford Instruments.
3. GIT Systems and LithoMetrix User Manual, Revision 1.9, Green Imaging Technologies.
4. American Petroleum Institute, *Recommended Practices for Core Analysis*, API Publications, Washington, D.C., (1998), p. 5-7.
5. Pittman, E. D., *Porosity diagenesis and productive capability of sandstone reservoirs*, (1979).

We claim:
1. A method for nuclear magnetic resonance ("NMR") measurement of a crushed porous media sample, where the crushed porous media sample is at least as large as a pore size of the porous media, comprising:
   providing a sample vessel which is NMR invisible,
   providing a measured volume for the sample vessel,
   placing the sample in the sample vessel and saturating the sample with a fluid, measuring a volume of the sample and the fluid by a NMR scan, removing the fluid from the sample vessel, subjecting the sample in the sample vessel to a centrifugal force, measuring the volume of the sample by a NMR scan following centrifugation, and calculating a petrophysical property of the sample using the measured volume of the sample vessel, the measured volume of the sample and the measured volume of the sample and the fluid.

2. The method of claim 1, wherein the centrifugal force is of a sufficient magnitude and duration to remove sufficient fluid from surfaces of the sample without removing a significant amount of fluid from the pores.

3. The method of claim 1, wherein the sample comprises drill cuttings of an earth formation removed from a wellbore.

4. The method of claim 1, wherein the fluid is a liquid or a gas.

5. The method of claim 1, wherein the fluid is a brine.

6. The method of claim 5, wherein the sample is saturated to about 100% using the fluid.

7. The method of claim 2, wherein the centrifugal force is determined by a property of the sample.

8. The method of claim 7 wherein the property is sample size.

9. The method of claim 2, wherein the duration is determined by a property of the sample.

10. The method of claim 9 wherein the property is sample size.

11. The method of claim 1 wherein the nuclear magnetic resonance measurement is a Car-Purcell-Meiboom-Gill (CPMG) echo train.

12. The method of claim 1, wherein the petrophysical property is porosity.

13. The method of claim 1, wherein the petrophysical property is pore size distribution.

14. The method of claim 11, further comprising saturating the sample with more than one fluid where at least one fluid is a nuclear magnetic resonance visible fluid and where the petrophysical property is porosity.

15. The method of claim 1, wherein the step of saturating the sample with a fluid is performed under a vacuum.

16. The method of claim 1, wherein the sample is surrounded by a NMR inactive liquid or gas during centrifugation.

17. The method of claim 1, wherein the sample is surrounded by air during centrifugation.

18. The method of claim 1, wherein the volume is measured by filling the vessel to a given level with a brine and performing a NMR scan of the vessel with the brine and determining the volume from the acquired NMR data.

19. The method of claim 1, wherein the vessel is a vial comprising an outlet for draining the fluid from the vial.

20. The method of claim 19, wherein the vial is made from a NMR invisible material.

21. The method of claim 20, wherein the material is tetrafluoroethylene or polytetrafluoroethylene.

22. The method of claim 20, wherein the vial further comprises a removable mesh in the outlet for preventing the sample from being removed from the vial when the fluid is drained.

* * * * *